United States Patent [19]

Koene

[11] Patent Number: 5,943,752
[45] Date of Patent: Aug. 31, 1999

[54] ARRANGEMENT FOR THE MANUFACTURE OF MULTILAYERS

[75] Inventor: Johan Willem Koene, Enter, Netherlands

[73] Assignee: Ceraprint, Enter, Netherlands

[21] Appl. No.: 08/930,194

[22] PCT Filed: Mar. 12, 1996

[86] PCT No.: PCT/EP96/01104

§ 371 Date: Sep. 30, 1997

§ 102(e) Date: Sep. 30, 1997

[87] PCT Pub. No.: WO96/31102

PCT Pub. Date: Oct. 3, 1996

[30] Foreign Application Priority Data

Mar. 30, 1995 [NL] Netherlands ............................. 9500615

[51] Int. Cl.[6] .............................. B23P 23/00; H01R 43/00
[52] U.S. Cl. ............................... 29/33 M; 29/759; 29/830
[58] Field of Search .................................. 29/33 M, 720, 29/721, 703, 830, 845, 846, 852, 848, 739, 729, 759

[56] References Cited

U.S. PATENT DOCUMENTS

| 4,307,832 | 12/1981 | Taki et al. | 29/740 X |
| 4,588,468 | 5/1986 | McGinty et al. | 29/33 M |
| 5,048,178 | 9/1991 | Bindra et al. | 29/721 X |
| 5,172,472 | 12/1992 | Lindner et al. | 29/845 |
| 5,377,404 | 1/1995 | Berg | 29/703 X |
| 5,383,269 | 1/1995 | Rathmell et al. | 29/830 |
| 5,456,778 | 10/1995 | Fukuta | 29/846 X |
| 5,630,272 | 5/1997 | Wenke | 29/852 |

FOREIGN PATENT DOCUMENTS

| 9500615 | 3/1995 | Netherlands | 29/33 M |

*Primary Examiner*—William Briggs
*Attorney, Agent, or Firm*—Oblon, Spivak McClelland, Maier & Neustadt, P.C.

[57] ABSTRACT

An apparatus for manufacturing a multilayer carrier for electronic components. Individual layers have a printed wire pattern applied thereto by a dispenser with the required holes being made by a perforator. The apparatus manipulates the individual layers so that the final multilayer is obtained automatically. The dispenser and perforator are positioned one over the other so that a compact high accuracy arrangement is obtained. This apparatus is particularly suitable for processing layers of green ceramic.

20 Claims, 2 Drawing Sheets

ARRANGEMENT FOR THE MANUFACTURE OF MULTILAYERS

BACKGROUND OF THE INVENTION

1. Field of the Invention

The present invention relates to an arrangement for the manufacture of carriers for electronic components, composed of several insulating layers, each layer provided with a printed wire pattern made of conducting material and holes filled with conducting material for the interconnection of the printed wire patterns of different layers, comprising a table, movable in a horizontal plane, and a dispenser, for providing with a semifinished product placed on the movable table with a printed wire pattern, a layer holder, movable in a horizontal plane, and a perforator, for punching holes in a layer that is to be added, and transport means for placing the newly perforated additional layer on the semi-finished product.

2. Discussion of the Background

An arrangement of this type is known from the Dutch patent application Nr. 9000148. The drawback of this prior art arrangement is that it performs the different operations side by side, as a consequence of which the dimensions of the arrangement are relatively large. This renders the arrangement expensive and it adversely affects the accuracy and speed with which a carrier can be produced.

SUMMARY OF THE INVENTION

The arrangement according to the invention does not have this drawback, and is characterized in that the dispenser and the perforator are positioned one over the other, enabling the different operations to be performed over one another. A particular effect is that alignment errors between the dispenser and the perforator are at least substantially nonexistent. In order to at least substantially preclude any alignment errors between the table and the holder, too, the table and the layer holder, according to a favourable embodiment of the invention, are also positioned one over the other, such that the dispenser and the perforator perform their operations at least substantially simultaneously on the semifinished product and the layer to be added respectively, the alignment being continuously ensured owing to the favourable disposition of the dispenser, the perforator, the table and the holder.

A further favourable embodiment of the invention is characterized in that the table and the layer holder effectively form one whole and the layer holder comprises supporting means fitted to the underside of the table, for seizing a layer on at least two opposing edges. The layer hangs then in fact on the two opposing edges, enabling the perforator to work on the layer at two sides from a free edge.

A still further favourable embodiment of the invention is characterized in that the supporting means comprises a system of suction apertures, which systems acts on the upper side of the layer.

A still further favourable embodiment, which is technically simple to implement and which ensures a good reproducibility, is characterized in that the table and layer holder combination is movably positioned in a first direction, and the dispenser and perforator combination in a second direction, perpendicular to the first direction.

In a still further favourable embodiment the perforator comprises a baseplate supporting the layer to be processed, provided with a piercing punch penetrating the baseplate and a die opening located above the layer to be processed. To prevent scrap punched from the insulating material from contaminating the layer to be processed, the die opening is provided, in a favourable embodiment, with clearing means, such as a suction arrangement.

Since in view of the required tolerances manual transporting of a perforated layer is indavisable, the transport means comprise, according to a further inventive embodiment, a feed-out table positioned next to the dispenser in the first direction, for taking over a perforated layer from the layer holder. The feed-out table is preferably a push-up table, which is pressed against the perforated layer suspended from the layer holder and positioned above the push-up table, whereupon the layer holder releases the layer. As shifting of the perforated layer on the feed-out table is unacceptable, the feed-out table is preferably provided with suction apertures which retain the layer in place.

For the subsequent transportation of the perforated layer the transport means may further comprise a transfer table, for taking the layer from the feed-out table and placing it on the table or on the semifinished product. An advantageous implementation of the arrangement is obtained by attaching the transfer table to the dispenser and the perforator, so that the transfer table can be moved in the second direction using the drive already present. The transfer table may then for instance consist of a plate provided on the underside with suction apertures, which can be positioned over the transfer table, whereupon the feed-out table implemented as push-up table presses the perforated layer against the transfer table. Subsequently the transfer table can take over the perforated layer and move it until it is over the semifinished product, after which the table, for instance with the aid of the feed-out table as push-up means, is moved upwards for accepting the new perforated layer.

With the feed-out table placed on one side next to the dispenser, the arrangement may also be provided with a feed-in table positioned on the other side next to the dispenser, for applying an unprocessed layer to the layer holder. The feed-in table is then preferably also provided with push-up means, such that an unprocessed layer placed manually or automatically on the feed-in table can be pressed against the layer holder positioned above it.

BRIEF DESCRIPTION OF THE DRAWINGS

An arrangement according to the invention will now be explained with reference to the following figures, of which.

DISCUSSION OF THE PREFERRED EMBODIMENTS

Figure 1:
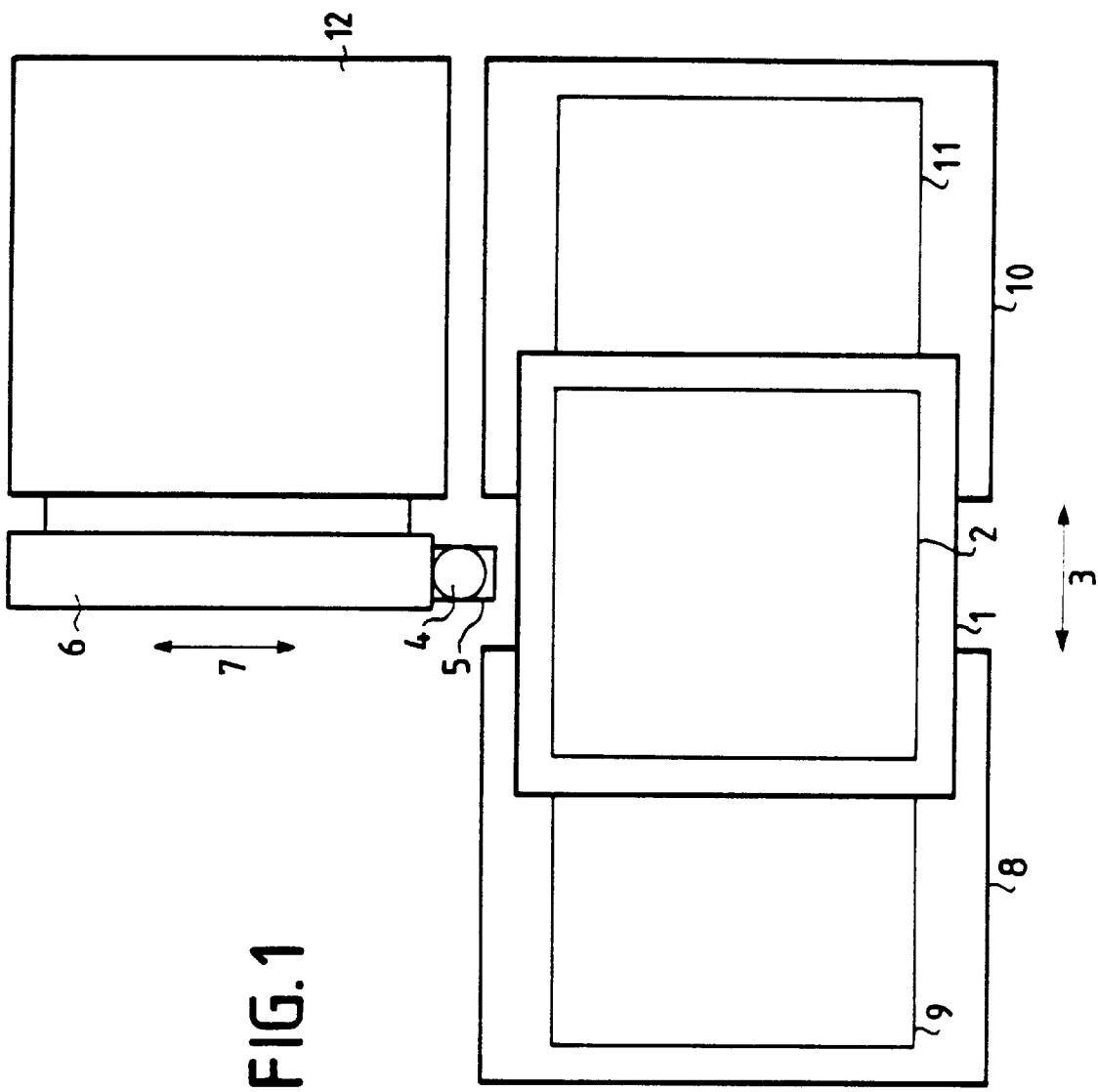
FIG. 1 schematically, in top view, represents a possible disposition of the table, the dispenser, the feed-in table, the feed-out table and the transfer table.

FIG. 1 shows in top view a table 1, comprising an already partly assembled carrier 2, which table is capable of moving in a first direction 3, for instance with the aid of first guide means (not shown) and a spindle driven by a first motor (not shown). FIG. 1 additionally shows a dispenser 4 as known in the art, with a perforator 5 positioned exactly beneath it. Dispenser 4 and perforator 5 are attached to a common yoke 6, which can move in a second direction 7, for instance likewise with the aid of second guide means (not shown) and a second spindle driven by a second motor (not shown).

Thus, with the aid of the first motor and the second motor, dispenser 4 can be positioned over any point of carrier 2 and, using the dispenser, a printed wire pattern can be traced on the upper surface of carrier 2 according to a method known in the art.

Besides, FIG. 1 shows a feed-in table 8 on which, manually or automatically, a yet unprocessed insulating layer 9 can be placed which, after holes have been punched in it in a manner to be subsequently described, will eventually be placed on carrier 2. Use is made in this process of a feed-out table 10, on which a perforated insulating layer 11 can be placed temporarily, before it can be transferred, in a manner to be subsequently described in greater detail, to carrier 2 by a transfer table 12 likewise shown in FIG. 1.

Figure 2:
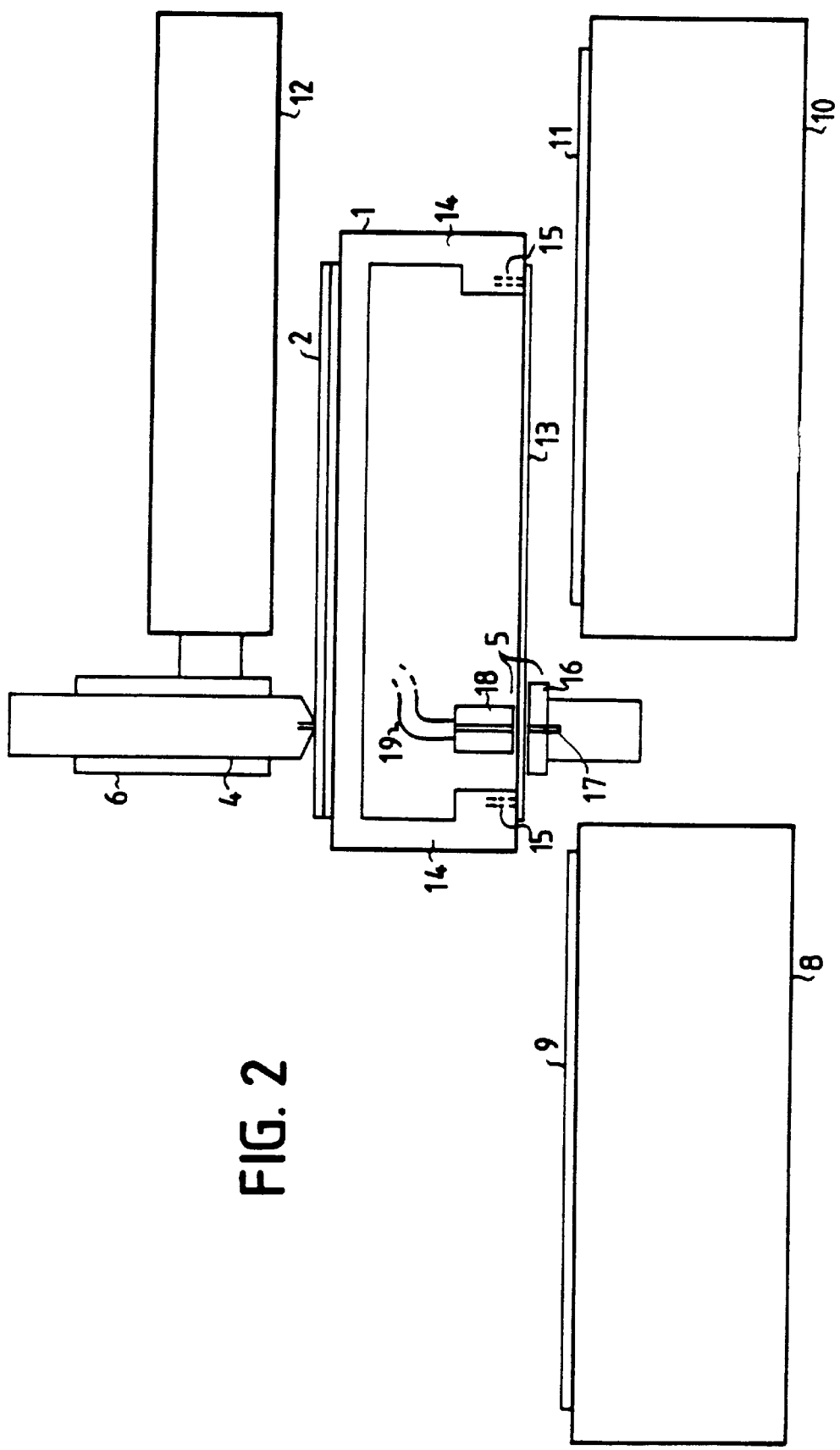
FIG. 2 schematically, in front view, represents a possible disposition of the table, the dispenser, the perforator, the layer holder, the feed-in table, the feed-out table and the transfer table.

FIG. 2 shows in front view table 1, comprising the already partly assembled carrier 2, the feed-in table 8 comprising an as yet unprocessed layer 9 and the feed-out table 10 comprising an insulating layer 11 already provided with perforations. Furthermore is shown a layer 13, suspended from a layer holder 14, layer holder 14 effectively forming one whole with table 1 and provided with suction apertures 15, on which an underpressure is maintained via a suction system (not shown), such that layer 13 sticks to layer holder 14. As layer 13 is attached at two edges only, the remaining surface of layer 13 is fully accessible to perforator 5, which consists of a base plate 16, provided with an automatically actuatable piercing punch 17, penetrating baseplate 16, and a die opening 18 which cooperates with piercing punch 17. To die opening 18 is connected a suction arrangement 19, which allows for the clearing away of the scrap produced during punching. Also shown is dispenser 4 which applies, at least substantially simultaneously with the punching of the holes, the required printed wires to the layer already provided with holes in the preceding process operation, which layer now forms the top layer of carrier 2.

Usually, if a layer 13 is stuck to layer holder 14, there will be no perforated layer 11 on feed-out table 10, as removing the layer, i.e. placing it on carrier 2, is the obvious course of action before the production of a new layer is begun.

The complete process cycle of a carrier 2 may now be described as follows:

On feed-in table 8 an unprocessed insulating layer 9 is placed. Layer holder 14, with the aid of the first motor, is positioned over the layer, and feed-in table 8 is pushed upwards with the aid of push-up means, for instance a pneumatically actuated system of bellows, fitted below feed-in table 8. As soon as the layer lies against layer holder 14, underpressure is applied to the suction apertures 15, causing the layer to be held fast. Then table 1, and with it also layer holder 14, is brought into the position in which the perforator can make the required holes in the layer. In this case, for the correct positioning, the first and the second motors are controlled in combination. Simultaneously with the holes being punched, dispenser 4 may apply, on the top surface of a carrier 2 or a semifinished product that is possibly already present on table 1, the required printed wire pattern and fill the holes in the layer manufactured in a previous process operation, in places where a connection with an underlying layer is needed.

When all the holes have been made layer holder 14 is positioned, with the aid of the first motor, above feed-out table 10, whereupon feed-out table 10, with the aid of push-up means, is moved against the perforated layer. Then the underpressure on suction apertures 15 is removed, so that the perforated layer comes to rest on feed-out table 10. As shifting the layer at this moment would be disastrous to the end product, the feed-out table 10 has also been provided with suction apertures, with which the layer can be immobilized. Subsequently yoke 6 is shifted, with the aid of the second motor, such that transfer table 12 is moved over the perforated layer. With the aid of the push-up means of feed-out table 10 the perforated layer is pressed against transfer table 12, whereupon the suction apertures fitted to the underside of transfer table 12 take over the perforated layer. Table 1 is subsequently moved, with the aid of the first motor, below the perforated layer, such that this layer is positioned exactly over the partly assembled carrier 2 which may be already present on table 1. Next, with the aid of the push-up means of the feed-out table 10 which is now positioned below table 1, table 1, which is movable in a vertical sense, is pushed upwards, the perforated layer ending up on top of the partly assembled carrier 2. The perforated layer is pressed with some force on to carrier 2, whereupon the underpressure is removed from the suction apertures fitted in transfer table 12.

The completed carrier may finally be removed manually from table 1, for any further processing.

Before the perforated layer is placed on the already partly assembled carrier 2 it is usually necessary for the printed wire pattern applied by dispenser 4 to the top layer of carrier 2 to be left drying. In this case use can advantageously be made of drying techniques known in the art, based on heating using an infrared source, on a forced air stream or on underpressure applied locally to the top layer. Additionally it may be useful, depending on the type of layer employed for the building up of carrier 2, to apply a local or integral coat of glue between the layers. This may for instance be achieved with the aid of an additional dispenser, which is not described further here because for this type of operation tolerances are not critical.

With some types of layer it is unnecessary to apply a glue coat, because the layers are mutually immobilized in a subsequent operation. This is for instance the case with layers made from green ceramic, when the carriers during the subsequent operations are pressed together and baked. If gluing is not necessary or undesirable it is recommendable to immobilize the semifinished product, which on table 1 is exposed to strong accelerations during the application of the printed wiring, in a different way, for instance using an automatically controlled clamping device that seizes two opposing edges of the top layer of carrier 2, which previously made contact with layer holder 14.

For the control of the motors, the push-up tables, the dispenser, the perforator and the various suction apertures a suitably programmed computer, as usual in the art, can be employed.

We claim:

1. Arrangement for the manufacture of carriers for electronic components, composed of several insulating layers, each layer provided with a printed wire pattern made of conducting material and holes filled with conducting material for the interconnection of the printed wire patterns of different layers, comprising a table, movable in a horizontal plane, and a dispenser, for providing a semifinished product placed on the movable table with a printed wire pattern, a layer holder, movable in a horizontal plane, and a perforator, for punching holes in a layer that is to be added, and transport means for placing the newly perforated additional layer on the semifinished product, characterized in that the dispenser and the perforator are positioned one over the other.

2. Arrangement as claimed in claim 1, characterized in that the table and the layer holder are positioned one over the other, and in that the dispenser and the perforator perform their operations at least substantially simultaneously on the semifinished product and the layer to be added respectively.

3. Arrangement as claimed in claim 2, characterized in that the table and the layer holder effectively form one whole and the layer holder comprises supporting means fitted to the underside of the table, for seizing a layer on at least two opposing edges.

4. Arrangement as claimed in claim 3, characterized in that the supporting means comprise a system of suction apertures, which system acts on the upper side of the layer.

5. Arrangement as claimed in claim 2 characterized in that the table and layer holder combination is movably positioned in a first direction, and the dispenser and perforator combination in a second direction, perpendicular to the first direction.

6. Arrangement as claimed in claim 5, characterized in that the perforator comprises a baseplate supporting the layer to be added, provided with a piercing punch and a die opening which is located above the layer to be processed.

7. Arrangement as claimed in claim 6, characterized in that the die opening is provided with clearing means, for the removal of scrap punched from the insulating material.

8. Arrangement as claimed in claim 7, characterized in that the clearing means comprise a suction arrangement.

9. Arrangement as claimed in claim 5, characterized in that the transport means comprise a feed-out table positioned next to the dispenser in the first direction, for taking over a perforated layer from the layer holder.

10. Arrangement as claimed in claim 9, characterized in that the feed-out table is provided with push-up means.

11. Arrangement as claimed in claim 10, characterized in that the transport means also comprise a transfer table, for taking the perforated layer from the feed-out table and placing it on the table.

12. Arrangement as claimed in claim 11, characterized in that the transfer table with the dispenser can move in the second direction.

13. Arrangement as claimed in claim 12, characterized in that the transfer table comprises a plate, provided on the underside with suction apertures, which is movable together with the dispenser and the perforator.

14. Arrangement as claimed in claim 1, characterized in that also is provided a feed-in table positioned next to the dispenser in the first direction, for applying an unprocessed layer to the layer holder.

15. Arrangement as claimed in claim 14, characterized in that the feed-in table is provided with push-up means.

16. Arrangement as claimed in claim 3, characterized in that the table and layer holder combination is movably positioned in a first direction, and the dispenser and perforator combination in a second direction, perpendicular to the first direction.

17. Arrangement as claimed in claim 4, characterized in that the table and layer holder combination is movably positioned in a first direction, and the dispenser and perforator combination in a second direction, perpendicular to the first direction.

18. Arrangement as claimed in claim 16, characterized in that the perforator comprises a baseplate supporting the layer to be added, provided with a piercing punch and a die opening which is located above the layer to be processed.

19. Arrangement as claimed in claim 17, characterized in that the perforator comprises a baseplate supporting the layer to be added, provided with a piercing punch and a die opening which is located above the layer to be processed.

20. Arrangement as claimed in claim 16, characterized in that the transport means comprise a feed-out table positioned next to the dispenser in the first direction, for taking over a perforated layer from the layer holder.

* * * * *